(12) United States Patent
Jones et al.

(10) Patent No.: US 10,085,357 B2
(45) Date of Patent: Sep. 25, 2018

(54) GLASS ENCLOSURES FOR ELECTRONIC DEVICES

(71) Applicant: Google LLC, Mountain View, CA (US)

(72) Inventors: Warren Jones, Mountain View, CA (US); Charles Woodhull, Mountain View, CA (US); Bryan Kiple, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/365,328

(22) Filed: Nov. 30, 2016

(65) Prior Publication Data
US 2017/0215294 A1   Jul. 27, 2017

Related U.S. Application Data

(60) Provisional application No. 62/287,316, filed on Jan. 26, 2016.

(51) Int. Cl.
*H05K 5/02* (2006.01)
*H04B 1/03* (2006.01)

(52) U.S. Cl.
CPC ................. *H05K 5/0243* (2013.01)

(58) Field of Classification Search
CPC .............................. H05K 5/0243; G06F 1/184
USPC ................................ 361/814, 728–730, 752
See application file for complete search history.

(56) References Cited

U.S. PATENT DOCUMENTS

| | | | |
|---|---|---|---|
| 6,483,719 B1 | 11/2002 | Bachman | |
| 8,576,561 B2* | 11/2013 | Myers | G06F 1/1626 361/679.56 |
| 8,780,581 B2* | 7/2014 | Merz | H01Q 1/243 361/799 |
| 9,119,293 B2* | 8/2015 | Mycroft | H04M 1/0249 |
| 9,235,240 B2* | 1/2016 | Pakula | G06F 1/1626 |

(Continued)

FOREIGN PATENT DOCUMENTS

| | | |
|---|---|---|
| WO | 2011/114190 | 9/2011 |
| WO | 2012/047784 | 4/2012 |

(Continued)

OTHER PUBLICATIONS

Office Action and Search Report issued in British Application No. GB1620886.1 dated May 12, 2017, 11 pages.

(Continued)

*Primary Examiner* — Hung S Bui
(74) *Attorney, Agent, or Firm* — Fish & Richardson P.C.

(57) ABSTRACT

The disclosed embodiments include enclosures for electronic devices formed from RF-transparent, toughened glass materials, such as chemically hardened alkali-aluminosilicate glass. For example, according to the disclosed embodiments, an enclosure for an electronic device may be formed from a plurality of enclosure components joined together along corresponding interfaces to establish an enclosure structure, or alternatively, may be formed from a single enclosure component. In some aspects, the enclosure structure may have corresponding first and second ends, the enclosure structure may have corresponding first and second surfaces, and the second surface may be exposed to an environment. The enclosure may also include first and second cap components disposed at corresponding ones of the first and second ends.

14 Claims, 6 Drawing Sheets

(56) References Cited

U.S. PATENT DOCUMENTS

| | | | |
|---|---|---|---|
| 9,795,047 B1* | 10/2017 | Lee | H05K 7/1418 |
| 2006/0119760 A1 | 6/2006 | Okuda | |
| 2009/0325776 A1 | 12/2009 | Murata | |
| 2011/0003619 A1 | 1/2011 | Fujii | |
| 2011/0048755 A1* | 3/2011 | Su | H05K 5/0243 |
| | | | 174/50 |
| 2012/0069517 A1 | 3/2012 | Prest et al. | |
| 2013/0076612 A1 | 3/2013 | Myers | |
| 2013/0318766 A1 | 12/2013 | Kiple et al. | |
| 2014/0098472 A1* | 4/2014 | Zhang | H05K 5/02 |
| | | | 361/679.01 |
| 2016/0147264 A1* | 5/2016 | Kil | G06F 1/1626 |
| | | | 345/173 |

FOREIGN PATENT DOCUMENTS

| | | |
|---|---|---|
| WO | 2013/048868 | 4/2013 |
| WO | 2013/112433 | 8/2013 |
| WO | 2014/055496 | 4/2014 |

OTHER PUBLICATIONS

International Search Report and Written Opinion issued in International Application No. PCT/US2016/064151, dated Feb. 17, 2017, 11 pages.

* cited by examiner

GLASS ENCLOSURES FOR ELECTRONIC DEVICES

CROSS REFERENCE TO RELATED APPLICATION

This application claims the benefit of U.S. Provisional Application No. 62/287,316, filed Jan. 26, 2016, the contents of which are incorporated by reference herein.

FIELD

This specification describes technologies related to enclosures suitable for housing electronic devices.

BACKGROUND

Many consumer electronic device include components that transmit or receive radio-frequency (RF) signals across various communications networks using internal antennas. Thus, enclosures for these devices must be electromagnetically transparent to the transmitted or received RF signals. In many instances, the requirement for RF transparency, when coupled with durability considerations, limit enclosure materials to plastics and other metals.

SUMMARY

The disclosed embodiments relate to enclosures for electronic devices formed from RF-transparent, toughened glass materials, such as chemically hardened alkali-aluminosilicate glass. As additional description to the embodiments described below, the present disclosure describes the following embodiments.

Embodiment 1 is directed to an enclosure for an electronic device. The enclosure comprises a plurality of enclosure components, the enclosure components being joined together along corresponding interfaces to establish an enclosure structure, the enclosure structure having corresponding first and second ends, the enclosure structure having corresponding first and second surfaces, the second surface being exposed to an environment. The enclosure comprises first and second cap components disposed at corresponding ones of the first and second ends, wherein at least one of the enclosure components comprises a material that is electromagnetically transparent to radio-frequency (RF) signals.

Embodiment 2 is the enclosure of embodiment 1, wherein the first surface encloses an inner region of the enclosure structure. The first and second cap components isolate the inner region from the environment.

Embodiment 3 is the enclosure of embodiment 1, further comprising the electronic device, the electronic device being disposed within the inner region.

Embodiment 4 is the enclosure of embodiment 1, wherein the material comprises a chemically hardened alkali-aluminosilicate glass.

Embodiment 5 is the enclosure of embodiment 4, wherein the chemically hardened alkali-aluminosilicate glass is doped with at least one colored pigment.

Embodiment 6 is the enclosure of embodiment 1, wherein the enclosure components are joined together using at least one of a welding process that applies heat to the corresponding interfaces, an ultrasonic welding process, or an application of an adhesive to the interfaces.

Embodiment 7 is the enclosure of embodiment 1, wherein the enclosure components comprise a first elongated enclosure component and a second elongated enclosure component. The interfaces comprise first and second interfaces, the first and second interfaces being disposed along elongated edges of the first and second elongated enclosure components. The first and second enclosure components are joined together along the corresponding first and second interfaces.

Embodiment 8 is the enclosure of embodiment 7, wherein a cross-sectional shape of the enclosure comprises an ellipsoid.

Embodiment 9 is the enclosure of embodiment 1, wherein the enclosure components comprise first and second elongated enclosure plates and first and second elongated support rails, the support rails being disposed between the first and second elongated enclosure plates. The first and second elongated enclosure plates are joined to the first elongated support rail along first and second interfaces. The first and second elongated enclosure plates are joined to the second elongated support rail along third and fourth interfaces.

Embodiment 10 is the enclosure of embodiment 9, wherein a cross-sectional shape of the enclosure comprises a regular or irregular polygon.

Embodiment 11 is the enclosure of embodiment 1, further comprising graphics disposed on at least one of the first or second surfaces.

Embodiment 12 is the enclosure of embodiment 1, wherein at least one of an anti-reflective coating, an oleophobic coating, or a scratch-resistance coating is applied to the second surface.

Embodiment 13 is an enclosure for an electronic device. The enclosure comprises an enclosure component comprising material that is electromagnetically transparent to radio-frequency (RF) signals, the enclosure component having corresponding first and second ends, the enclosure component having corresponding first and second surfaces, the second surface being exposed to an environment. The enclosure comprises first and second cap components disposed at corresponding ones of the first and second ends.

Embodiment 14 is the enclosure of embodiment 13, wherein the first surface encloses an inner region of the enclosure structure. The first and second cap components isolate the inner region from the environment.

Embodiment 15 is the enclosure of embodiment 14. The enclosure further comprises the electronic device, the electronic device being disposed within the inner region.

Embodiment 16 is the enclosure of embodiment 13, wherein the material comprises a chemically hardened alkali-aluminosilicate glass.

Embodiment 17 is the enclosure of embodiment 16, wherein the chemically hardened alkali-aluminosilicate glass is doped with at least one colored pigment.

Embodiment 18 is the enclosure of embodiment 13, wherein a cross-sectional shape of the enclosure component comprises at least one of an ellipsoid, a regular polygon, or an irregular polygon.

Embodiment 19 is the enclosure of embodiment 13. The method further comprises graphics disposed on at least one of the first or second surfaces.

Embodiment 20 is the enclosure of embodiment 13, wherein at least one of an anti-reflective coating, an oleophobic coating, or a scratch-resistance coating is applied to the second surface.

Embodiment 21 is a method of manufacturing an enclosure for an electronic device. The method comprises joining together a plurality of enclosure components along corresponding interfaces to form an enclosure structure, the enclosure components comprising a material that is electromagnetically transparent to radio-frequency (RF) signals, the enclosure structure having corresponding first and second ends and corresponding first and second surfaces, the second surface being exposed to an environment. The method comprises applying a chemical hardening process to the enclosure structure; and in response to the applied chemical hardening process, polishing at least one of the first or second surfaces.

Embodiment 22 is the method of embodiment 21, wherein the material comprises a chemically hardened alkali-aluminosilicate glass.

Embodiment 23 is the method of embodiment 22, wherein applying the chemical hardening process comprises immersing the enclosure structure in an ion-exchange bath.

Embodiment 24 is the method of embodiment 23, wherein the ion-exchange bath comprises a hot potassium salt ion-exchange bath.

Embodiment 25 is the method of embodiment 21, wherein the joining comprises applying heat sufficient to weld together the enclosure components along the corresponding interfaces.

Embodiment 26 is the method of embodiment 25. The method further comprises applying the chemical hardening process to the enclosure structure in response to the application of the heat, the application of the heat reducing a hardness of at least one of the enclosure components.

Embodiment 27 is the method of embodiment 21, wherein the joining comprises joining together the enclosure components along the corresponding interfaces using an ultrasonic welding process.

Embodiment 28 is the method of embodiment 21, wherein the joining comprises joining together the enclosure components along the corresponding interfaces by applying an adhesive along the interfaces.

Embodiment 29 is the method of embodiment 21. The method further comprises applying graphics to at least one of the polished first or second surfaces.

Embodiment 30 is the method of embodiment 21. The method further comprises applying at least one of an anti-reflective coating, an oleophobic coating, or a scratch-resistance coating is applied to the second surface.

Embodiment 31 is the method of embodiment 21. The method further comprises arranging the electronic device within the enclosure structure. The method further comprises affixing first and second cap portions to corresponding ones of the first and second ends after the electronic device has been arranged within the enclosure structure.

Embodiment 32 is a method of manufacturing an enclosure for an electronic device. The method comprises obtaining an enclosure component comprising material that is electromagnetically transparent to radio-frequency (RF) signals, the enclosure component having corresponding first and second ends, the enclosure component having corresponding first and second surfaces, the second surface being exposed to an environment. The method comprises establishing that at least one of an interior dimension or shape of the enclosure structure fails to conform to a specified tolerance, the specified tolerance facilitating loading of the electronic device within the unibody enclosure component. The method comprises performing at least one restriking process to conform the at least one interior dimension or shape with the specified tolerance.

Embodiment 33 is the method of embodiment 32, wherein the at least one restriking process comprises at least one of a milling process applied to the first surface or an immersion of the enclosure structure in a chemical etchant.

Embodiment 34 is the method of embodiment 32. The method further comprises polishing the at least one of the first or second surface.

Embodiment 35 is the method of embodiment 34. The method further comprises applying graphics to at least one of the polished first or second surfaces.

Embodiment 36 is the method of embodiment 32. The method further comprises applying at least one of an anti-reflective coating, an oleophobic coating, or a scratch-resistance coating is applied to the second surface.

Embodiment 37 is the method of embodiment 32. The method further comprises arranging the electronic device within the enclosure structure. The method further comprises affixing first and second cap portions to corresponding ones of the first and second ends.

Embodiment 38 is the method of embodiment 32, wherein the material comprises a chemically hardened alkali-aluminosilicate glass.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
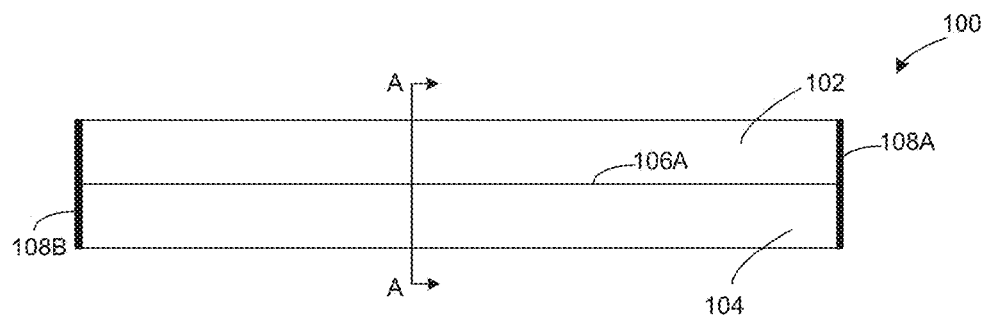
FIGS. 1A-1E and 2A-2E illustrate an exemplary modular enclosure for an electronic device, consistent with the disclosed embodiments.
Figure 1B:
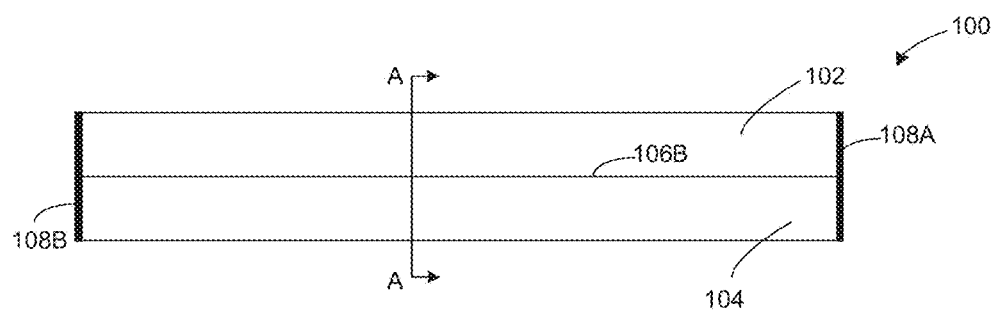

FIGS. 1A and 1B are left- and right-side elevations illustrating portions of an exemplary enclosure 100 for an electronic device. For example, as illustrated in FIGS. 1A and 1B, enclosure 100 may be formed from a first enclosure portion 102 and a second enclosure portion 104, which may be joined together along interfaces 106A and 106B to form an enclosure structure capable of housing one or more components of the electronic device (not shown).

Enclosure 100 may also include cap portions 108A and 108B, which may seal the components of the electronic device within enclosure 100. In some aspects, cap portions 108A and/or 108B may be affixed mechanically to corresponding ends of enclosure 100 (e.g., through screws, pins, and/or liquid glue), and may also include one or more interfaces capable of connecting the electronic device to other devices, power sources (e.g., through an appropriate connection), and input/output (I/O) devices, such as headphones. In additional aspects, cap portions 108A and 108B may be formed from a metallic and/or plastic material capable of sealing and/or isolating the electronic device from an exterior environment, and further, capable of functioning as a bumper that protects the electronic device and/or enclosure 100 from sudden shocks (e.g., drops etc.).

Figure 1C:
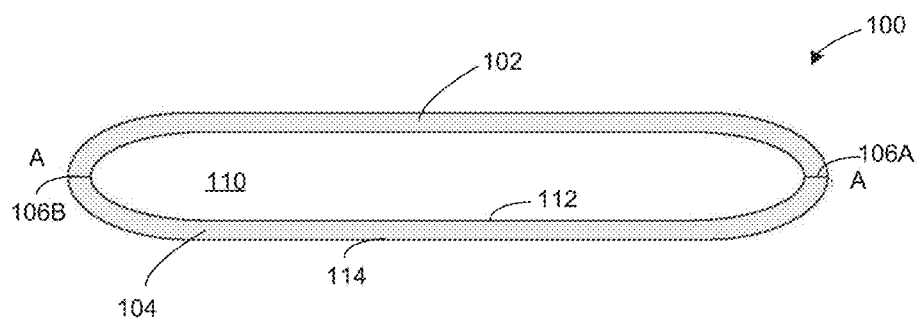

FIG. 1C is a cross-sectional view (e.g., taken along section line A of FIGS. 1A and 1B) that further illustrates portions of exemplary enclosure 100, in accordance with the disclosed embodiments. For example, when joined along interfaces 106A and 106B, first and second enclosure portions 102 and 104 may establish the enclosure structure, which may be defined by an inner surface 112 and an exterior surface 114, and which may enclose a region 110 into which the electronic device may be disposed. In some aspects, depicted in FIG. 1C, the enclosure structure and region 110 may be characterized by an ellipsoid cross-sectional shape, and the dimensions of the ellipsoid cross-sectional shape may be tailored to enable enclosure 100 to closely confine the electronic device components while minimizing variations in space between these components and inner surface 112.

Figure 1D:
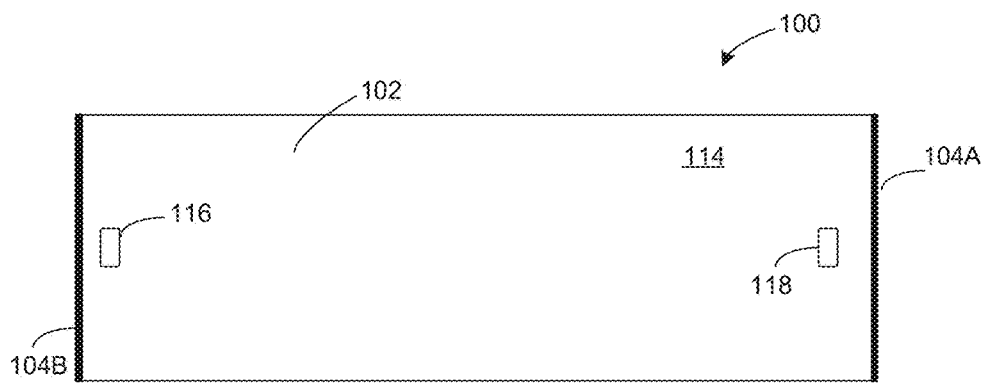
Figure 1E:
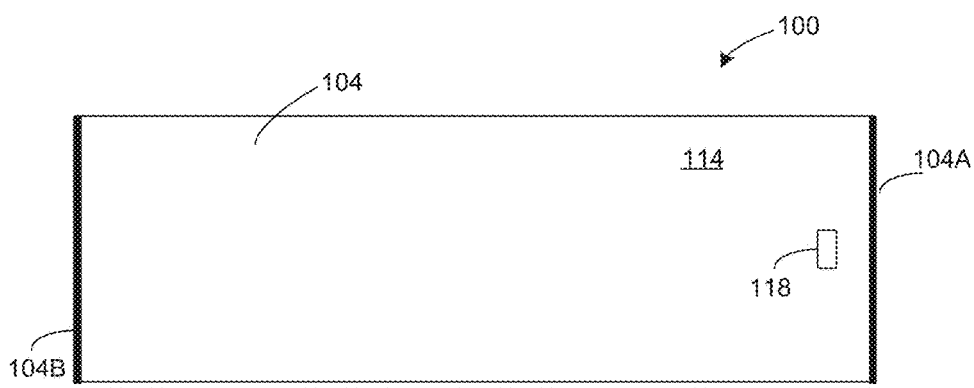

FIGS. 1D and 1E are top and bottom plan views illustrating additional portions of enclosure 100, consistent with the disclosed embodiments. For example, as illustrated in FIGS. 1D and 1E, exterior surface 114 of enclosure 100 (e.g., the surface exposed to a user's touch) may be include one or more apertures, such as apertures 116 and 118, that provide access to enclosed region 110 and one or more of the components of the electronic device. In some aspects, additional device components (e.g., speakers, microphones, digital cameras, other I/O devices, etc.) may be mounted within apertures 116 and/or 118.

In an embodiment, the electronic device housed within enclosure 100 may include components of a mobile telephone, smart phone, or other mobile device a radio-frequency (FR) transceiver capable to transmitting and receiving RF signals across one or more mobile communications networks, with these components not being covered by a housing or enclosure other than the glass enclosure components described here. In other words, there may not be a housing or structure between the electronics of the mobile device and the glass enclosure, such that the glass enclosure forms the housing for the device. Consumers may purchase separate after-market cases to cover the device, which includes the glass enclosure as part of the device. This discussion of the glass enclosure forming the housing for the device such it serves as the primary element protecting the electronics of the device from physical damage applies to all embodiments of this disclosure.

First and second enclosure components 102 and 104 may be formed from a material that is electromagnetically transparent to the transmitted and/or received RF signals. For example, first and second enclosure portions 102 and 104 may be formed from a glass, such as an alkali-aluminosilicate glass, chemically hardened to increase its surface strength, resistance to cracks, and ability to contain flaws. Chemical-hardening processes consistent with the disclosed embodiments may include, but are not limited to, processes that immerse first and second enclosure portions 102 and 104 into an ion-exchange bath (e.g., a hot potassium salt ion-exchange bath) to place exterior surface 114 of first and second enclosure components 102 and 104 under compressive stress. The disclosed embodiments are, however, not limited to first and second enclosure portions formed from chemically hardened alkali-aluminosilicate glass, and in other aspects, first and second enclosure components 102 and 104 may be formed from any additional or alternate toughened material appropriate to the electronic device and electromagnetically transparent to the transmitted and/or received RF signals.

Further, and as described above, first and second enclosure portions 102 and 104 may be joined together along interfaces 106A and 1066 to form enclosure 100. In one aspect, one or more heat treatments may be applied along interfaces 106A and 1066 to join together first and second enclosure portions 102 and 104 (and thus form enclosure 100). For example, first and second enclosure portions 102 and 104 may welded together along interfaces 106A and 1066 to form enclosure 100. In other aspects, and consistent with the disclosed embodiments, first and second enclosure portions 102 and 104 may be joined together using any additional or alternate heat treatment capable of joining together first and second enclosure portions 102 and 104 and appropriate to the materials (e.g., chemically hardened alkali-aluminosilicate glass) constituting first and second enclosure portions 102 and 104.

In some aspects, the application of heat to weld or otherwise join together first and second enclosure portions 102 and 104 along interfaces 106A and 106B may modify physical and/or chemical characteristics of first and second enclosure portions 102 and 104. For example, as described above, first and/or second enclosure portions 102 and 104 may be formed from chemically hardened alkali-aluminosilicate glass, and the application of heat sufficient to weld together first and/or second enclosure portions 102 and 104 may reduce a hardness of the underlying alkali-aluminosilicate glass.

To remedy the reduction in material hardness associated with the welding process, the disclosed embodiments may subject enclosure 100 (e.g., which results from welding together first and second enclosure portions 102 and 104) to one or more additional chemical hardening processes. In one aspect, and upon completion of the welding process, the disclosed embodiments may apply a chemical hardening process identical or similar to that used to chemically harden the alkali-aluminosilicate glass that forms first and second enclosure portions 102 and 104. For instance, enclosure 100 may be immersed into an ion-exchange bath, such as a hot potassium salt ion-exchange bath, to increase chemically the hardness of the alkali-aluminosilicate glass that forms enclosure 100 to a degree comparable to the initial hardness of the first and second enclosure portions 102 and 104 (i.e., prior to welding). The disclosed embodiments are, however, not limited these exemplary chemical hardening processes, and in other aspects, enclosure 100 may be subjected to any additional or alternate chemical or physical hardening process appropriate to its constituent materials and its intended use.

Further, the disclosed embodiments are not limited to processes that join together first and second enclosure portions 102 and 104 through the application of heat (e.g., welding). In other embodiments, first and second enclosure portions 102 and 104 may be joined together to form enclosure 100 through ultrasonic welding techniques, and additionally or alternatively, through an application of a liquid adhesive, such as epoxy along interfaces 106A and 106B.

As described above, certain processes that join together first and second enclosure portions 102 and 104 along interfaces 106A and 106B (e.g., heat treatments, ultrasonic welding, and/or adhesives) may modify the physical or physical structure of the underlying glass. These modifications may, in some aspects, also introduce defects and/or aberrations visible within the glass (e.g., tangency difficulties). In certain aspects, a manufacturer's choice of such processes may be guided not only based on a loss of strength due to the application of heat, but also based on an extent to which these processes introduce tangency difficulties into enclosure 100.

Once first and second enclosure portions 102 and 104 are joined together to form enclosure 100, the disclosed processes may apply one or more polishing processes to inner and outer surfaces 112 and 114. In some instances, the polishing processes may include, but are not limited to, an application of abrasive polishing compounds to inner and outer surfaces 112 and 114, a disposition of enclosure 100 within an agitated polishing media, and any additional or alternate technique appropriate to first and second enclosure portions 102 and 104. Through the application of these exemplary polishing techniques, enclosure 100 may appear to be constructed from a single piece of alkali-aluminosilicate glass (e.g., and have a unibody construction) despite being formed from first and second enclosure portions 102 and 104 joined together along interfaces 106A and 106B.

Further, in some aspects, color and/or monochrome graphics may be disposed on all or a portion of inner surface 112 (i.e., the surface not touched by a user) after completion of the chemical hardening and polished processes. The disclosed embodiments are not, however, limited to processes that apply graphics to inner surface 112, and in other aspects, artwork and/or graphics may be disposed on all or a portion of exterior surface 114 after completion of the chemical hardening and polishing processes. For example, the artwork and/or graphical may be applied by hand (e.g., by an artist), may be applied through processes that successively apply, pattern, and remove masks on inner surface 112 and/or exterior surface 114, and/or using any other technique (e.g., spray painting, printing, etc.) appropriate to the graphics and to the surfaces of enclosure 100.

In some embodiments, a clear coating may be applied onto exterior surface 114 (and additionally or alternatively, to inner surface 112) to protect the applied graphics and to reduce any damage to the applied graphics resulting from normal usage. In other embodiments, additional coatings may be applied to exterior surface 114 after completion of the chemical hardening and polishing processes, and additionally or alternatively, after application of the graphics to exterior surface 114. For example, the disclosed embodiments may apply an anti-reflective (AR) coating to exterior surface 114, and further, may apply an oleophobic coating to exterior surface 114 to reduce smudges on exterior surface 114 (e.g., due to a user's fingers). In additional instances, a surface treatment or coating may be applied to exterior surface 114 to increase a scratch resistance of exterior surface 114. The disclosed embodiments are, however, not limited to these exemplary surface treatments and coatings, and in other aspects, any additional or alternate appropriate coating may be applied to exterior surface 114.

In certain embodiments, described above, enclosure 100 may be characterized by an ellipsoid cross-sectional shape, and may formed from enclosure portions (e.g., first and second enclosure portions) having curved surfaces. The disclosed embodiments are not limited to these exemplary cross-sectional shapes, and as described below in reference to FIGS. 2A-2E, enclosures consistent with the disclosed embodiments may be formed from various enclosure portions having flat surfaces and characterized by polygonal cross-sectional shapes (e.g., rectangular, square, triangular, and other regular and irregular polygons).

Figure 2A:
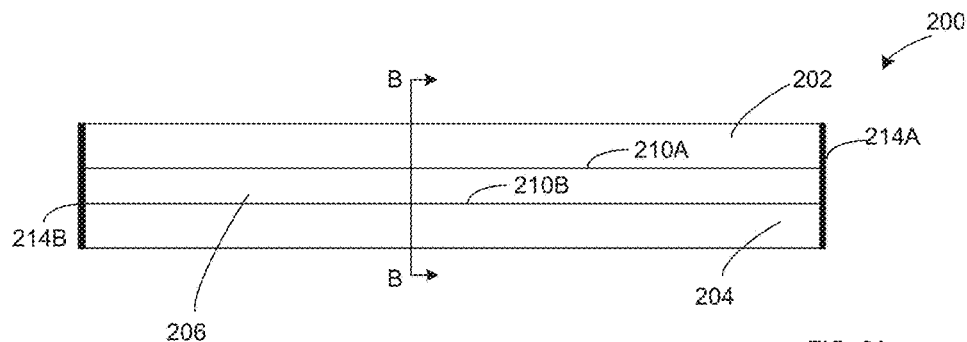
Figure 2B:
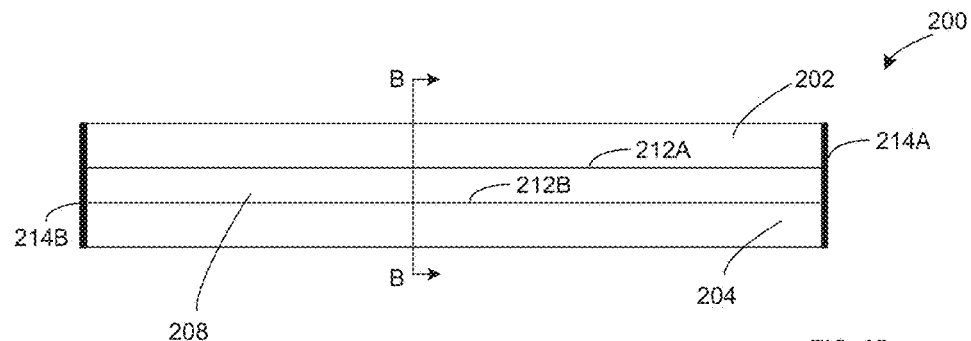

FIGS. 2A and 2B are left- and right-side elevations illustrating portions of an additional exemplary enclosure 200 for an electronic device. For example, as illustrated in FIGS. 2A and 2B, enclosure 100 may be formed from a first enclosure plate 202 and a second enclosure plate 204 separated by elongated rail supports 206 and 208. In some aspects, first enclosure plate 202, second enclosure plate 204, elongated rail support 206, and elongated rail support 208 may have flat surfaces and non-varying, regular or irregular cross-sectional shapes (e.g., square, rectangle, etc.). Further, as illustrated in FIGS. 2A and 2B, enclosure plate 202 and second enclosure plate 204 may be joined to elongated rail support 206 along interfaces 210A and 210B, and enclosure plate 202 and second enclosure plate 204 may be joined to elongated rail support 208 along interfaces 212A and 212B, to form a box-like structure capable of housing one or more components of the electronic device (not shown).

Enclosure 200 may also include cap portions 214A and 214B, which may seal the components of the electronic device within enclosure 200. As described above, cap portions 214A and 214B may be affixed mechanically to corresponding ends of enclosure 200 (e.g., through screws, pins, and/or liquid glue), and may also include one or more interfaces capable of connecting the electronic device to other devices, power sources (e.g., through an appropriate connection), and input/output (I/O) devices, such as headphones. In additional aspects, cap portions 214A and 214B may be formed from a metallic and/or plastic material capable of sealing and/or isolating the electronic device from an environment exterior to enclosure 200, and further, capable of functioning as a bumper that protects the electronic device and/or enclosure 200 from sudden shocks (e.g., drops etc.).

Figure 2C:
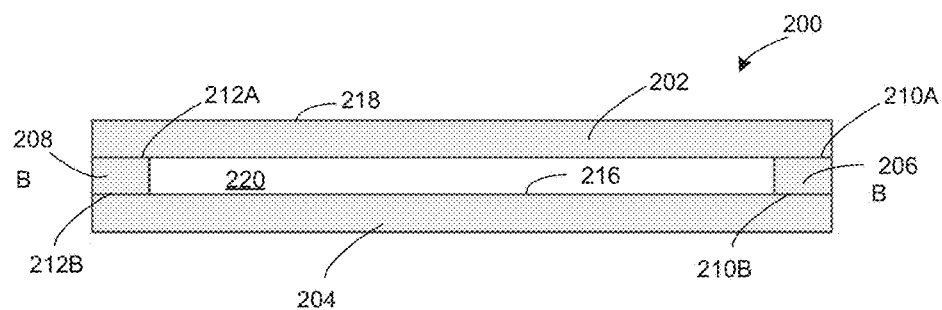

FIG. 2C is a cross-sectional view (e.g., taken along section line B of FIGS. 2A and 2B) that further illustrates portions of exemplary enclosure 200, in accordance with the disclosed embodiments. For example, when joined along interfaces 210A, 210B, 212A, and 212B, first enclosure plate 202, second enclosure plate 204, elongated rail support 206, and elongated rail support 208 may establish a box-like structure defined by an inner surface 216 and an exterior surface 218, and enclosing a region 220 into which the electronic device may be disposed. In some aspects, depicted in FIG. 2C, the box-like structure and region 110 may be characterized by a cross-section having a rectangular shape, and the dimensions of the rectangular cross-sectional shape may be tailored to enable enclosure 100 to closely confine the electronic device components while minimizing variations in space between these components and inner surface 216.

Figure 2D:
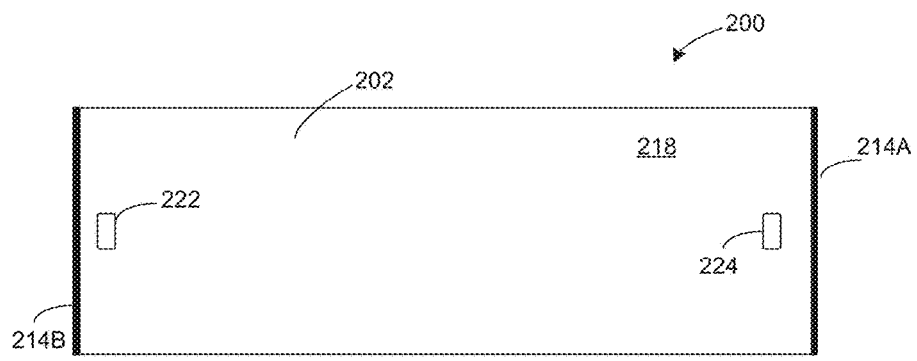
Figure 2E:
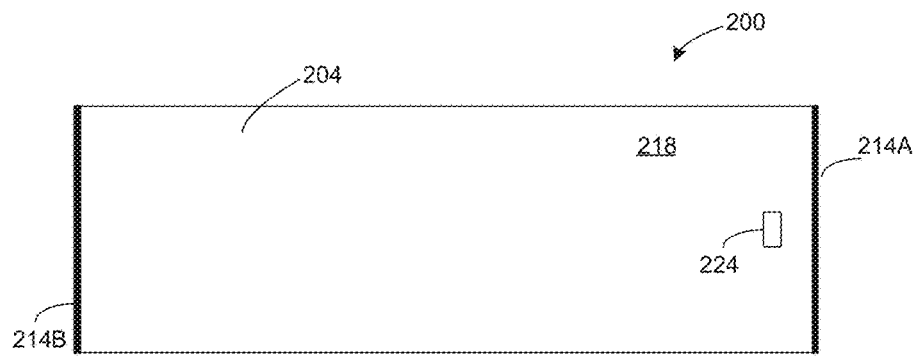

FIGS. 2D and 2E are top and bottom plan views illustrating additional portions of enclosure 200, consistent with the disclosed embodiments. For example, as illustrated in FIGS. 2D and 2E, portions of exterior surface 218 defined by first enclosure plate 202 and second enclosure plate 204 (e.g., portions of the surface exposed to a user's touch) may be include one or more apertures, such as apertures 222 and 224, that provide access to enclosed region 220 and one or more of the components of the electronic device. In some aspects, additional device components (e.g., speakers, microphones, digital cameras, other I/O devices, etc.) may be mounted within apertures 222 and/or 224. The additional device components may extend through one or both sides of apertures 222 and/or 224.

In some embodiments, enclosure 200 may house within region 220 an electronic device (e.g., one or more components of a mobile telephone, smart phone, or other mobile device) having a radio-frequency (FR) transceiver capable to transmitting and receiving RF signals across one or more mobile communications networks. To facilitate transmission and receipt of these RF signals, first enclosure plate 202, second enclosure plate 204, elongated rail support 206, and elongated rail support 208 may be formed from a material that is electromagnetically transparent to the transmitted and/or received RF signals, such as the chemically hardened alkali-aluminosilicate glass described above. The disclosed embodiments are, however, not limited to these exemplary RF-transparent materials, and in other aspects, one or more components of enclosure 200 may be formed from any additional or alternate toughened material that is appropriate to the electronic device and electromagnetically transparent to the transmitted and/or received RF signals.

Further, in certain aspects, first enclosure plate 202 and second enclosure plate 204 may be joined to elongated rail support 206 along interfaces 210A and 210B, and enclosure plate 202 and second enclosure plate 204 may be joined to elongated rail support 208 along interfaces 212A and 212B, using any of the exemplary techniques described above. For example, the disclosed embodiments may apply heat sufficient to weld together first enclosure plate 202, elongated rail supports 206 and 208, and second enclosure plate 204 along corresponding ones of interfaces 210A, 210B, 212A, and 212B. In other aspects, first enclosure plate 202, elongated rail supports 206 and 208, and second enclosure plate 204 may be joined together through an application of ultrasonic welding processes along corresponding ones of interfaces 210A, 210B, 212A, and 212B, through an application of an adhesive (e.g., liquid glue, epoxy, and/or resin) along corresponding ones of interfaces 210A, 210B, 212A, and 212B, or through any additional or alternate technique appropriate to the materials that constitute the components of enclosure 200.

In certain aspects, the application of heat to weld or otherwise join together one or more components of enclosure 200 may modify the physical and/or chemical characteristics of first enclosure plate 202, elongated rail supports 206 and 208, and/or second enclosure plate 204. For example, as described above, first enclosure plate 202, elongated rail supports 206 and 208, and/or second enclosure plate 204 may be formed from chemically hardened alkali-aluminosilicate glass, and the application of heat sufficient to weld together these components may reduce a hardness of the underlying alkali-aluminosilicate glass.

To mediate the reduction in material hardness associated with the welding process, the disclosed embodiments may subject enclosure 200 to one or more additional chemical hardening processes. In one aspect, and upon completion of the welding process, the disclosed embodiments may apply a chemical hardening process identical or similar to that used to chemically harden the alkali-aluminosilicate glass that forms first enclosure plate 202, elongated rail supports 206 and 208, and/or second enclosure plate 204. For instance, as described above, enclosure 200 may be immersed into an ion-exchange bath, such as a hot potassium salt ion-exchange bath, to increase chemically the hardness of the alkali-aluminosilicate glass that forms enclosure 200 to a degree comparable to the initial hardness of first enclosure plate 202, elongated rail supports 206 and 208, and/or second enclosure plate 204 (i.e., prior to welding). The disclosed embodiments are, however, not limited these exemplary chemical hardening processes, and in other aspects, enclosure 200 may be subjected to any additional or alternate chemical or physical hardening process appropriate to its constituent materials and its intended use.

As described above, certain processes that join together first enclosure plate 202, elongated rail supports 206 and 208, and second enclosure plate 204 along corresponding ones of interfaces 210A, 210B, 212A, and 212BB (e.g., heat treatments, ultrasonic welding, and/or adhesives) may modify the physical or physical structure of the underlying glass. These modifications may, in some aspects, introduce defects and/or aberrations visible within the glass (e.g., tangency difficulties). In certain aspects, a manufacturer's choice of such processes may be guided not only based on a loss of strength due to the application of heat, but also based on an extent to which these processes introduce tangency difficulties into enclosure 200.

Additionally, as described above, the disclosed embodiments may also apply one or more polishing processes to inner surface 216 and exterior surface 218 of enclosure 200 (e.g., an application of abrasive polishing compounds to inner and outer surfaces 216 and 218, a disposition of enclosure 200 within an agitated polishing media, etc.). Through the application of these exemplary polishing techniques, enclosure 200 may appear to be constructed from a single piece of alkali-aluminosilicate glass (e.g., a unibody construction) despite being formed from first enclosure plate 202, elongated rail supports 206 and 208, and second enclosure plate 204 joined together along corresponding ones of interfaces 210A, 210B, 212A, and 212B.

In certain embodiments, after completion of the chemical hardening and polishing processes described above, graphics may be applied to all or a portion of inner surface 216 (i.e., the surface not touched by a user) and additionally or alternatively, to all or a portion of exterior surface 218 (i.e., the surface touched by the user and exposed to the environment) using any of the exemplary techniques described above. Additionally, in some aspects, a clear coating may be applied onto exterior surface 218 (and additionally or alternatively, to inner surface 216) to protect the applied graphics and to reduce any damage to the applied graphics resulting from normal usage.

As described above, additional coatings may be applied to exterior surface 218 of enclosure 200 after completion of the chemical hardening and polishing processes (and if appropriate, after application of the graphics to outer surface 216). For example, the disclosed embodiments may apply an anti-reflective (AR) coating to exterior surface 218, and further, may apply an oleophobic coating to exterior surface 218 to reduce smudges on exterior surface 218 (e.g., due to contact with the user's fingers). In additional instances, a surface treatment or coating may be applied to exterior surface 218 to increase a scratch resistance of exterior surface 218. The disclosed embodiments are, however, not limited to these exemplary surface treatments and coating, and in other aspects, any additional or alternate appropriate coating to exterior surface 218.

In contrast to enclosure 100 described above, one or more components of enclosure 200 may have flat surfaces and may be characterized by cross-sections having regular or irregular polygonal shapes (e.g., rectangles, squares, etc.). The flat component surfaces and polygonal cross-sectional component shapes of enclosure 200 may render these components more amenable to chemical hardening (e.g., using any of the exemplary techniques described above) than comparable curved components of enclosure 200. Further, in additional aspects, graphics may be more readily and cost-effectively applied to the flat, planar surfaces of the components of enclosure 200 than to the curved, non-planar surfaces characteristic of enclosure 100.

In certain disclosed embodiments, enclosures for various devices may be formed modularly from two or more components fused or welded together along corresponding interfaces. Although highly polished to give the appearance of single-component, unibody construction, these modularly constructed enclosures (e.g., enclosures 100 and 200 described above) may nonetheless exhibit visual defects along these fused or welded interfaces. In other aspects, described below in reference to FIGS. 3A-3D, the disclosed embodiments may include hollow, unibody enclosures formed from a single enclosure component without fused or welded interfaces. Mobile device electronics (e.g., a processor, speaker, display) may be placed within the enclosure components before the enclosure components are fused or welded together.

Figure 3A:
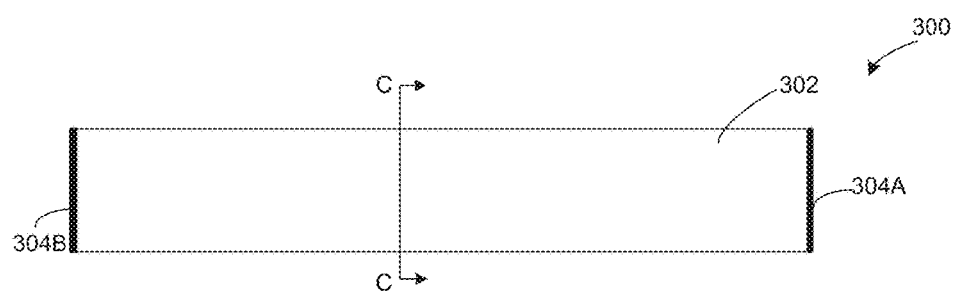
FIGS. 3A-3D illustrate an exemplary unibody enclosure for an electronic device, consistent with the disclosed embodiments.

FIG. 3A is a side elevation illustrating portions of an exemplary unibody enclosure 300 capable of housing one or more components of an electronic device, consistent with the disclosed embodiments. In certain aspects, as described above, the one or more electronic device components may include, but are not limited to, components of a mobile telephone, smart phone, or other electronic device having a radio-frequency (FR) transceiver capable to transmitting and receiving RF signals across one or more mobile communications networks.

For example, as illustrated in FIG. 3A, unibody enclosure 300 may be formed from a single enclosure component 302, which may be an elongated structure capable of housing one or more components of the electronic device (not shown). In contrast to the module enclosures described above, unibody enclosure 300 is formed from enclosure component 302 and thus, includes no interfaces requiring fusing or welding. Due to the lack of fused or welded interfaces, unibody enclosure 300 may thus not require an application of subsequent chemical hardening processes to remedy a loss of hardness resulting from the welding or fusing process.

Further, and as described above, unibody enclosure 300 may also include cap portions 304A and 304B, which may seal the components of the electronic device within enclosure 300. In some aspects, cap portions 304A and 304B may be affixed mechanically to corresponding ends of enclosure 100 (e.g., through screws, pins, and/or liquid glue), and may also include one or more interfaces capable of connecting the electronic device to other devices, power sources (e.g., through an appropriate connection), and input/output (I/O) devices, such as headphones. In additional aspects, cap portions 108A and 108B may be formed from a metallic and/or plastic material capable of sealing and/or isolating the electronic device from an environment exterior to enclosure 100, and further, capable of functioning as a bumper that protects the electronic device and/or enclosure 100 from sudden shocks (e.g., drops etc.).

Figure 3B:
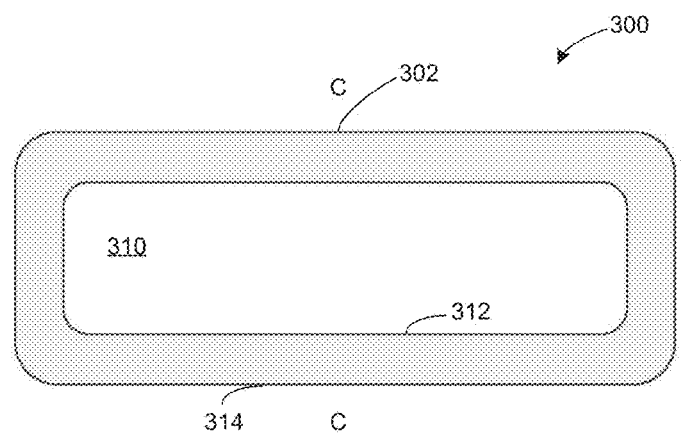

FIG. 3B is a cross-sectional view (e.g., taken along section line C of FIG. 3A) that further illustrates portions of unibody enclosure 300, in accordance with the disclosed embodiments. For example, enclosure component 302 of unibody enclosure 300 may establish an enclosure structure defined by an inner surface 312 and an exterior surface 314, and may enclose a region 310 into which the electronic device may be disposed (not depicted in FIG. 3C). In some aspects, depicted in FIG. 1C, unibody enclosure 300 may be characterized by a generally ellipsoid cross-sectional shape, the dimensions of which may be tailored to enable enclosure 300 to closely confine the electronic device components while minimizing variations in space between these components and inner surface 312.

Figure 3C:
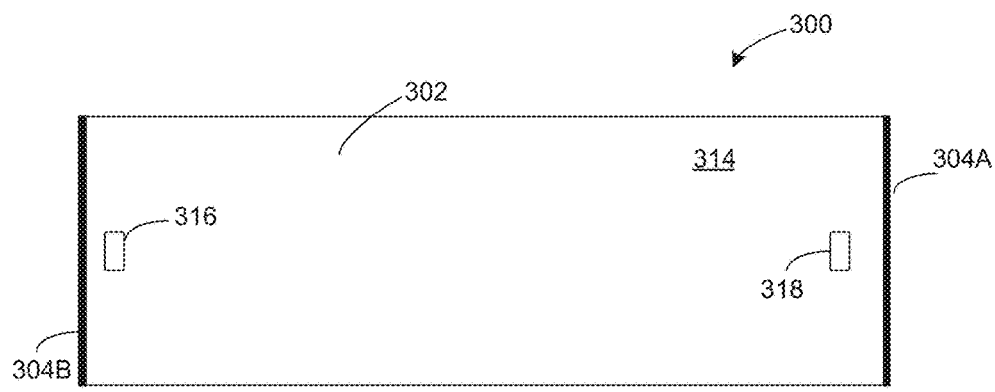
Figure 3D:
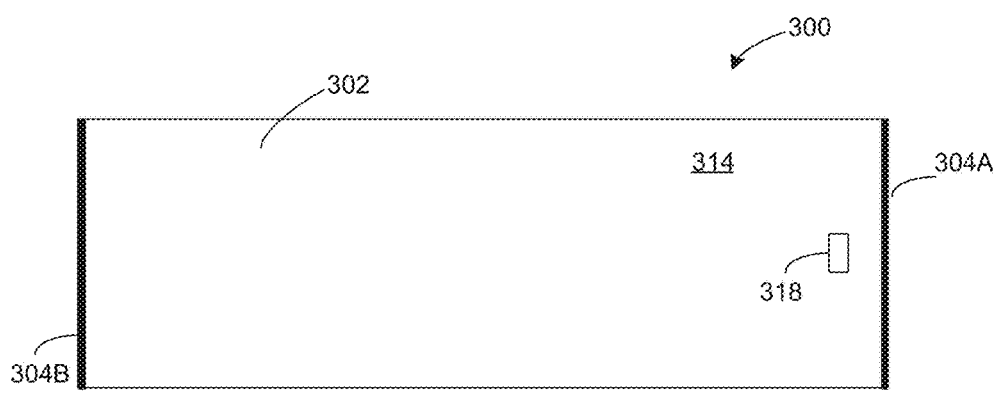

FIGS. 3C and 3D are top and bottom plan views illustrating additional portions of unibody enclosure 300, consistent with the disclosed embodiments. For example, as illustrated in FIGS. 3C and 3D, exterior surface 314 of unibody enclosure 300 (e.g., the surface exposed to a user's touch) may be include one or more apertures, such as apertures 316 and 318, that provide access to enclosed region 310 and one or more of the components of the electronic device. In some aspects, additional device components (e.g., speakers, microphones, digital cameras, other I/O devices, etc.) may be mounted within apertures 316 and/or 318.

In certain embodiments, as described above, the electronic device housed within unibody enclosure 300 may include components of a mobile telephone, smart phone, or other mobile device a radio-frequency (FR) transceiver capable to transmitting and receiving RF signals across one or more mobile communications networks. In certain aspects, enclosure component 302 may be formed from a material that electromagnetically transparent to the transmitted and/or received RF signals. For example, single enclosure component 302 may be formed from a drawn or extruded tube of alkali-aluminosilicate glass, which may be chemically hardened to increase its surface strength, resistance to cracks, and ability to contain flaws. Chemical-hardening processes consistent with the disclosed embodiments may include, but are not limited to, processes that immerse enclosure portion 302 into an ion-exchange bath (e.g., a hot potassium salt ion-exchange bath) to place exterior surface 314 under compressive stress. The disclosed embodiments are, however, not limited to unibody enclosures portions formed from chemically hardened alkali-aluminosilicate glass, and in other aspects, enclosure component 302 may be formed from any additional or alternate toughened material appropriate to the electronic device and electromagnetically transparent to the transmitted and/or received RF signals.

As described above, the one or more components of the electronic device may be disposed (e.g., "slid") within region 310 of unibody enclosure 300, and these electronic device components must be locked into place (e.g., mechanically fastened or wedged) to prevent unplanned and unnecessary movement that might damage the electronic device or reduce its functionality. The disclosed embodiments may, in some aspects, require tight dimensional tolerances during manufacture of enclosure component 302 (e.g., during one or more drawing or extrusion processes) to reduce a magnitude and a frequency of gaps between the electronic device components and inner surface 312 (e.g., to facilitate the locking of the components into place). These drawing and/or extrusion processes may be incapable of maintaining the required dimensional tolerances, and in some aspects, a manufacturer of enclosure component 202 may apply one or more restriking or reworking processes to the inner surface 312 (and additionally or alternatively, outer surface 314) to ensure that the extruded or drawn tube satisfies the dimensional tolerances required to efficiently lock down the enclosed electronic device.

For example, restriking or reworking processes consistent with the disclosed embodiments may include, but are not limited to, processes that mill or machine inner surface 312 and/or outer surface 314, and further, processes that immerse enclosure 300 into one or more chemical etchants to selectively etch portions of inner surface 312 and/or outer surface 314. In other aspects, consistent with the disclosed embodiments, the manufacturer may re-heat enclosure component 302 to an appropriate transition state (and additionally or alternatively, maintain enclosure component 302 in an appropriate transition after drawing or extrusion), insert a blank of appropriate size and/or shape into region 310 of enclosure component 302, and perform operations that compress enclosure component 302 about the inserted blank to conform enclosure component 302 to the desired size or shape. In some aspects, the manufacturer may then remove the blank from region 310. The disclosed embodiments are, however, not limited to these exemplary restriking and reworking processes, and in other aspects, the manufacturer may apply any additional or alternate restriking or reworking process appropriate to enclosure component 302, its constituent materials, and the desired size or shape.

The disclosed embodiments may apply one or more polishing processes to surfaces 312 and 314 (e.g., an application of abrasive polishing compounds, a disposition of enclosure 300 within an agitated polishing media, etc.). Further, in some aspects, color and/or monochrome graphics may be applied to all or a portion of inner surface 312 (i.e., the surface not touched by a user) and additionally or alternatively, to all or a portion of exterior surface 314 (i.e., the surface touched by the user and exposed to the environment) using any of the exemplary techniques described above. In certain embodiments, a clear coating may be applied onto exterior surface 314 (and additionally or alternatively, to inner surface 312) to protect the applied graphics and to reduce any damage to the applied graphics resulting from normal usage.

Further, additional coatings may be applied to exterior surface 314 of enclosure 300. For example, the disclosed embodiments may apply an anti-reflective (AR) coating to exterior surface 314, and further, may apply an oleophobic coating to exterior surface 314 to reduce smudges on exterior surface 314. In additional instances, a surface treatment or coating may be applied to exterior surface 114 to increase a scratch resistance of exterior surface 314. The disclosed embodiments are, however, not limited to these exemplary surface treatments and coating, and in other aspects, any additional or alternate appropriate coating may be applied to exterior surface 314.

In the embodiments described above, enclosures for electronic devices may be formed from a toughened, RF-transparent glass, such as a chemically hardened alkali-aluminosilicate glass. In some aspects, portions of these exemplary enclosures may be transparent to visible light (e.g., which may facilitate a user's viewing of and interaction with a touchscreen interface of the electronic device). In other aspects, and the chemically hardened alkali-aluminosilicate glass may be doped with one or more pigments to provide colors and/or patterns to portions of these exemplary enclosures. For example, the chemically hardened alkali-aluminosilicate glass that forms second enclosure portion 104 of enclosure 100 may be doped with colored pigment (e.g., red or black), while the chemically hardened alkali-aluminosilicate glass that forms first enclosure portion 102 may remain undoped. In some instances, the selective doping of the chemically hardened alkali-aluminosilicate glass may provide enclosure 100 (and additionally or alternatively, enclosures 200 or 300) with visually distinctive portions that may be personalized to corresponding users.

Further, as described above, enclosures consistent with the disclosed embodiments may incorporate one or more apertures (e.g., apertures 116 and 118 of enclosure 100, apertures 222 and 224 of enclosure 200, and apertures 316 and 318 of enclosure 300) into which one or more components of the electronic device may be mounted (e.g., speakers, microphones, cameras, etc.). In other aspects, however, enclosures consistent with the disclosed embodiments may fully enclose the one of more components of the electronic device. For example, the components of the electronic device may include, among other things, an electromagnetic (EM) coupling capable of recharging a battery, and further, an acoustic coupler attached to an inner surface of an enclosure (e.g., inner surface 112 of enclosure 100) and capable of generating sound. In some aspects, and consistent with the disclosed embodiments, the one or more components of the electronic device may be sealed into and enclosed within the exemplary enclosures described above, presenting visually distinctive enclosures that may appeal to users.

A number of exemplary embodiments have been described. Nevertheless, it will be understood that various modifications may be made without departing from the spirit and scope of the disclosure. For example, various forms of the flows shown above may be used, with steps re-ordered, added, or removed.

Thus, particular embodiments have been described. Other embodiments are within the scope of the following claims. For example, the actions recited in the claims may be performed in a different order and still achieve desirable results.

What is claimed is:

1. An enclosure for an electronic device, comprising:
an enclosure structure that has a first end, a second end, an outer surface, and an inner surface that encloses an inner region of the enclosure structure, the enclosure structure comprising a plurality of components that include:
  (i) a first elongated enclosure plate formed of glass that is electromagnetically transparent to radio-frequency (RF) signals,
  (ii) a second elongated enclosure plate formed of glass that is electromagnetically transparent to RF signals,
  (iii) a first elongated support member formed of glass that is electromagnetically transparent to RF signals, the first elongated support member being joined to the first elongated enclosure plate at a first interface and being joined to the second elongated enclosure plate at a second interface, and
  (iv) a second elongated support member formed of glass that is electromagnetically transparent to RF signals, the second elongated support member being joined to the first elongated enclosure plate at a third interface and being joined to the second elongated enclosure plate at a fourth interface,
wherein the first elongated enclosure plate, the second elongated enclosure plate, the first elongated support member, and the second elongated support member define the inner surface of the enclosure structure that forms the inner region of the enclosure structure; and
a first cap component disposed at the first end.

2. The enclosure of claim 1, further comprising the electronic device, the electronic device being disposed within the inner region.

3. The enclosure of claim 1, wherein each of the first elongated enclosure plate, the second elongated enclosure plate, the first elongated support member, and the second elongated support member comprises a chemically hardened alkali-aluminosilicate glass.

4. The enclosure of claim 3, wherein the chemically hardened alkali-aluminosilicate glass is doped with at least one colored pigment.

5. The enclosure of claim 1, wherein the first elongated enclosure plate, the second elongated enclosure plate, the first elongated support member, and the second elongated support member are joined together using at least one of a welding process that applies heat to the corresponding interfaces, an ultrasonic welding process, or an application of an adhesive to the interfaces.

6. The enclosure of claim 1, wherein a cross-sectional shape of the enclosure structure comprises an ellipsoid.

7. The enclosure of claim 1, wherein a cross-sectional shape of the enclosure structure comprises a regular or irregular polygon.

8. The enclosure of claim 1, wherein at least one of an anti-reflective coating, an oleophobic coating, or a scratch-resistance coating is applied to the outer surface.

9. The enclosure of claim 1, wherein:
the first elongated support member comprises a single piece of electromagnetically transparent glass that joins to the first elongated enclosure plate at the first interface and that joins to the second elongated enclosure plate at the second interface; and
the second elongated support member comprises a single piece of electromagnetically transparent glass that joins to the first elongated enclosure plate at the third interface and that joins to the second elongated enclosure plate at the fourth interface.

10. The enclosure of claim 1, further comprising a second cap component disposed at the second end.

11. The enclosure of claim 10, wherein:
the first cap component is formed from a metallic and/or plastic material; and
the second cap component is formed from a metallic and/or plastic material.

12. The enclosure of claim 10, wherein:
the first cap component is mechanically affixed to the first end of the enclosure structure with glue; and
the second cap component is mechanically affixed to the second end of the enclosure structure with glue.

13. The enclosure of claim 10, wherein the first and second cap components isolate the inner region from an environment to which the outer surface is exposed.

14. The enclosure of claim 1, wherein the inner surface of the enclosure structure closely confines the electronic device within the inner region of the enclosure structure.

* * * * *